United States Patent
Khuti et al.

(10) Patent No.: US 9,568,974 B2
(45) Date of Patent: Feb. 14, 2017

(54) SYSTEM AND METHOD FOR MONITORING AND MANAGING DATA CENTER RESOURCES IN REAL TIME

(75) Inventors: Bharat A. Khuti, Madison, AL (US); Steven Geffin, Miami, FL (US); Richard Williams, Huntsville, AL (US); Joe Kutner, Owens Cross Roads, AL (US); Jack Basiago, Toney, AL (US); Sheldon Altman, New Haven, CT (US); Brian Williams, Stamford, CT (US); Juarez Carvalho, Boca Raton, FL (US); Michael Browner, Lauderhill, FL (US); Mitesh Patel, Coral Springs, FL (US); Kenneth L. Harper, Coral Springs, FL (US); James H. Shelton, Cooper City, FL (US); Steven Clark, Parkland, FL (US); Donald A. Sturgeon, Huntsville, AL (US); David John Cowen, Plantation, FL (US); Mark Kershner, Huntsville, AL (US); Steven R. Blackwell, Harvest, AL (US); Karl Mills, Lynnwood, WA (US); Yang Pu, Shenzhen (CN); Dai Jun, Shenzhen (CN); Richard M. Tobin, Marysville, OH (US); Aman Khan, Bethel, CT (US); Roy D. Pestone, Mount Vernon, NY (US); Jean-Maxime Lachapelle, Coral Springs, FL (US)

(73) Assignee: AVOCENT HUNTSVILLE, LLC, Huntsville, AL (US)

( * ) Notice: Subject to any disclaimer, the term of this patent is extended or adjusted under 35 U.S.C. 154(b) by 318 days.

(21) Appl. No.: 13/877,513

(22) PCT Filed: Sep. 30, 2011
(Under 37 CFR 1.47)

(86) PCT No.: PCT/US2011/054191
§ 371 (c)(1),
(2), (4) Date: Jul. 23, 2013

(87) PCT Pub. No.: WO2012/047746
PCT Pub. Date: Apr. 12, 2012

(65) Prior Publication Data
US 2014/0025968 A1    Jan. 23, 2014

Related U.S. Application Data

(60) Provisional application No. 61/389,616, filed on Oct. 4, 2010.

(51) Int. Cl.
*H05K 7/20* (2006.01)
*G06F 1/32* (2006.01)
(Continued)

(52) U.S. Cl. (Continued)
CPC ............. *G06F 1/3206* (2013.01); *G06F 1/206* (2013.01); *G06F 1/3203* (2013.01); *G06F 8/24* (2013.01);
(Continued)

(58) Field of Classification Search
CPC ..... H05K 7/20836; G06F 1/206; G06F 1/3206
See application file for complete search history.

(56) References Cited

U.S. PATENT DOCUMENTS

| 7,210,048 B2 | 4/2007 | Bodas |
| 2006/0112286 A1 | 5/2006 | Whalley et al. |

(Continued)

FOREIGN PATENT DOCUMENTS

| CN | 1779600 A | 5/2006 |
| CN | 101346681 A | 1/2009 |

OTHER PUBLICATIONS

International Search Report and Written Opinion for PCT/US2011/054191, mailed Apr. 4, 2012; ISA/EP.
(Continued)

*Primary Examiner* — Albert Wang
(74) *Attorney, Agent, or Firm* — Harness, Dickey & Pierce, P.L.C.

(57) ABSTRACT

A system for monitoring, controlling and optimizing power usage and cooling utilization within a data center infrastructure. The system may make use of a subsystem which is adapted to obtain real time information on both facility devices and information technology (IT) devices. The subsystem may be used to evaluate the real time information to provide an alert and diagnostic information with respect to at least one of the facility devices or at least one of the IT devices. The subsystem may also make use of a mechanism that provides real time control over at least one of the facility devices or at least one of the IT devices to optimize at least one of cooling utilization, power usage or performance of at least one of the facility devices or at least one of the IT devices.

20 Claims, 11 Drawing Sheets

(51) Int. Cl.
  *G06F 1/20* (2006.01)
  *G06F 9/44* (2006.01)
  *G06F 11/30* (2006.01)
  *H04L 12/24* (2006.01)
  *G06F 11/34* (2006.01)

(52) U.S. Cl.
  CPC ....... *G06F 11/3006* (2013.01); *G06F 11/3044* (2013.01); *G06F 11/3051* (2013.01); *G06F 11/3058* (2013.01); *G06F 11/3072* (2013.01); *H04L 41/0226* (2013.01); *H04L 41/50* (2013.01); *H05K 7/20836* (2013.01); *G06F 11/3409* (2013.01); *H04L 41/0253* (2013.01); *H04L 41/04* (2013.01); *Y02B 60/1275* (2013.01); *Y02B 60/165* (2013.01)

(56) References Cited

U.S. PATENT DOCUMENTS

| | | |
|---|---|---|
| 2006/0248360 A1 | 11/2006 | Fung |
| 2009/0231152 A1 | 9/2009 | Tung et al. |
| 2009/0319650 A1* | 12/2009 | Collins et al. ................ 709/223 |
| 2010/0010688 A1 | 1/2010 | Hunter |
| 2010/0211669 A1* | 8/2010 | Dalgas et al. ................ 709/224 |
| 2010/0235654 A1* | 9/2010 | Malik ................... G06F 1/3209 713/300 |
| 2011/0016342 A1 | 1/2011 | Rowan et al. |
| 2011/0077795 A1* | 3/2011 | VanGilder et al. ........... 700/300 |

OTHER PUBLICATIONS

State Intellectual Property Office of People's Republic of China Search Report for corresponding Chinese Patent Application for Invention No. 201180053672.3, dated Dec. 24, 2015, 4 pages.
State Intellectual Property Office of People's Republic of China Notification of the First Office Action and Text of the First Office Action, dated Jan. 4, 2016, 15 pages.

* cited by examiner

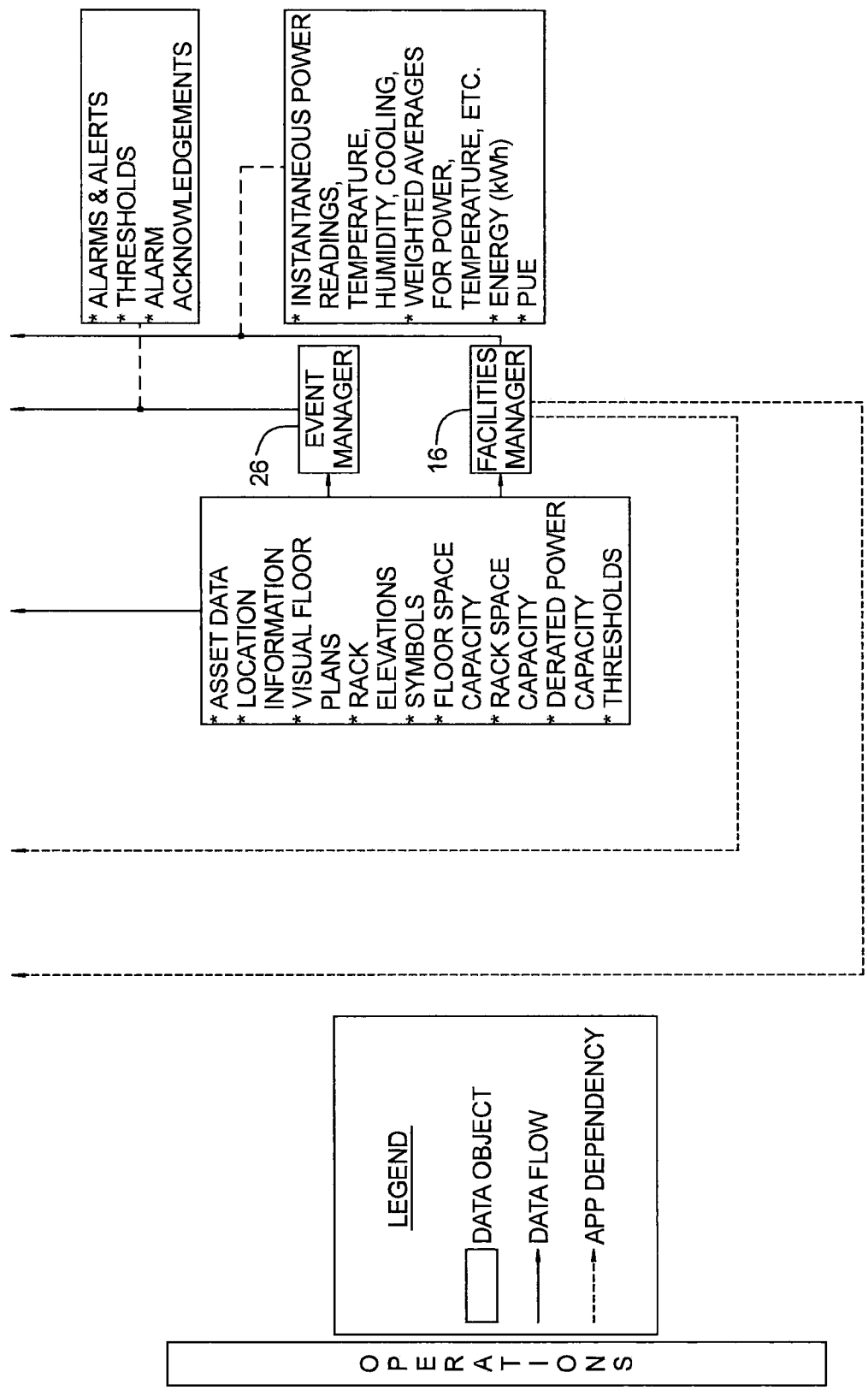

SYSTEM AND METHOD FOR MONITORING AND MANAGING DATA CENTER RESOURCES IN REAL TIME

CROSS-REFERENCE TO RELATED APPLICATIONS

This application claims the benefit of U.S. Provisional Application No. 61/389,616 filed on Oct. 4, 2010. The disclosure of the above application is incorporated herein by reference.

TECHNICAL FIELD

The present application is directed to systems and methods for managing the infrastructure associated with data centers, and particularly to a system and method for monitoring and managing hardware and software components of a modern day data center in a manner that optimizes the efficient use of the hardware and software components, and which also allows real time reconfiguration and control of the infrastructure components of the data center to meet changing needs and demands.

BACKGROUND

This section provides background information related to the present disclosure which is not necessarily prior art.

The common data center model has gone through many variations since its origins in mainframe computing. As shown in FIG. 1, from distributed computers, to the client/server model, the utilization of virtualized servers, grid consolidation, and most recently the trend toward utility or "cloud" computing, the demands on data centers are always changing and evolving, and the pace of that evolution is increasing as well.

Modern data centers are undergoing a broad transformation, which encompasses technical innovation, operational improvement, new design principles, changes in the data center supply chain, and changes to the relationship between IT and business. Thus, modern data centers are forming increasingly complex environments with many variables that must be taken into account when considering methods to optimize their efficiency. Along with this transformation comes the issue of energy efficiency and resource management, which will be vital to the success and long-term sustainment of these modern data centers. Currently, there exists a gap in information between the data center infrastructure layer (power, cooling, and space) and the information technology ("IT") infrastructure layer (e.g., computing, storage and communications) which is limiting organizations in optimizing efficiency. One example of the layers that form a typical data center is shown in FIG. 2. The ability to maximize efficiency depends upon being able to collect data from all the different components associated with the data center (i.e., IT and infrastructure), and to present the information in a useful way to the system administrators which enables them to make changes when necessary. This ability has come to be referred to among current professionals as "Data Center Infrastructure Management (DCIM)".

The need for a DCIM solution has been brought to light largely by the increase in consolidation and the associated virtualization, which has exposed the aforementioned gap between the IT layer and the infrastructure layer of a modern day data center, and especially the inefficiencies that this gap creates. The gap also poses a dilemma for data center managers: should they sacrifice efficiency by leaving unused capacity (e.g., electrical power capacity or cooling capacity) as a safety net against overloading, or should they use this capacity and increase efficiency at the risk of failure? One principal goal of the present DCIM system and method is to aid the decision-making process by providing accurate and real-time information to the system administrators in a useful and meaningful way. The bridging of the IT/infrastructure gap is crucial as the demands placed on data centers continue to grow into the future. But up until the present time, no suitable solutions have been proposed which can provide sufficient information to system administrators to accomplish the needed real time management of infrastructure resources to meet the changing needs of the IT layer.

SUMMARY

In one aspect the present disclosure is directed to a system for monitoring, controlling and optimizing power usage and cooling utilization within a data center infrastructure. The system may comprise a subsystem adapted to obtain real time information on both facility devices and information technology (IT) devices. The subsystem may also be adapted to evaluate the real time information to provide an alert and diagnostic information with respect to at least one of the facility devices or at least one of the IT devices. The subsystem may also be adapted to further provide a mechanism to take action concerning at least one of the facility devices or at least one of the IT devices based on the real time information. The action may be to optimize at least one of cooling utilization, power usage or performance of at least one of the facility devices or at least one of the IT devices.

In another aspect the present disclosure is directed to a system for real time monitoring and controlling of facility devices operating within a data center environment, in relation to electrical power being used by the facility devices, in a closed loop manner that optimizes power usage by the facility devices. The system may comprise a subsystem configured to obtain real time operating information on both facility devices and information technology (IT) devices. The subsystem may also be configured to evaluate the real time information to determine when an action should be taken relative to one or more of the facility devices, and to modify operation of the one or more facility devices, in real time, to optimize power usage with the data center environment.

In still another aspect the present disclosure may be directed to a system for real time monitoring and controlling of facility devices operating within a data center, in relation to available electrical power in the data center, in a closed loop manner that optimizes performance of the facility devices in relation to the available electrical power and the facility devices. The system may comprise a subsystem configured to obtain real time operating information on both facility devices and information technology (IT) devices. The subsystem may also be configured to evaluate the real time information to determine when an action should be taken relative to one or more of the IT devices. The subsystem may also modify operation of the one or more IT devices, in real time, to optimize performance of the one or more IT devices within the data center environment.

In still another aspect the present disclosure may be directed to a method for monitoring, controlling and optimizing power usage and cooling utilization within a data center infrastructure. The method may comprise obtaining real time information concerning both facility devices and information technology (IT) devices being used within the data center infrastructure. The method may use a processing system to evaluate the real time information to provide at least one of an alert and diagnostic information with respect to at least one of the facility devices or at least one of the IT devices. The method may also involve taking action concerning at least one of the facility devices or at least one of the IT devices based on the real time information, and with the action being to optimize at least one of cooling utilization, power usage or performance of at least one of the facility devices or at least one of the IT devices.

Further areas of applicability will become apparent from the description provided herein. The description and specific examples in this summary are intended for purposes of illustration only and are not intended to limit the scope of the present disclosure.

BRIEF DESCRIPTION OF DRAWINGS

The drawings described herein are for illustrative purposes only of selected embodiments and not all possible implementations, and are not intended to limit the scope of the present disclosure.

DETAILED DESCRIPTION

Figure 1:
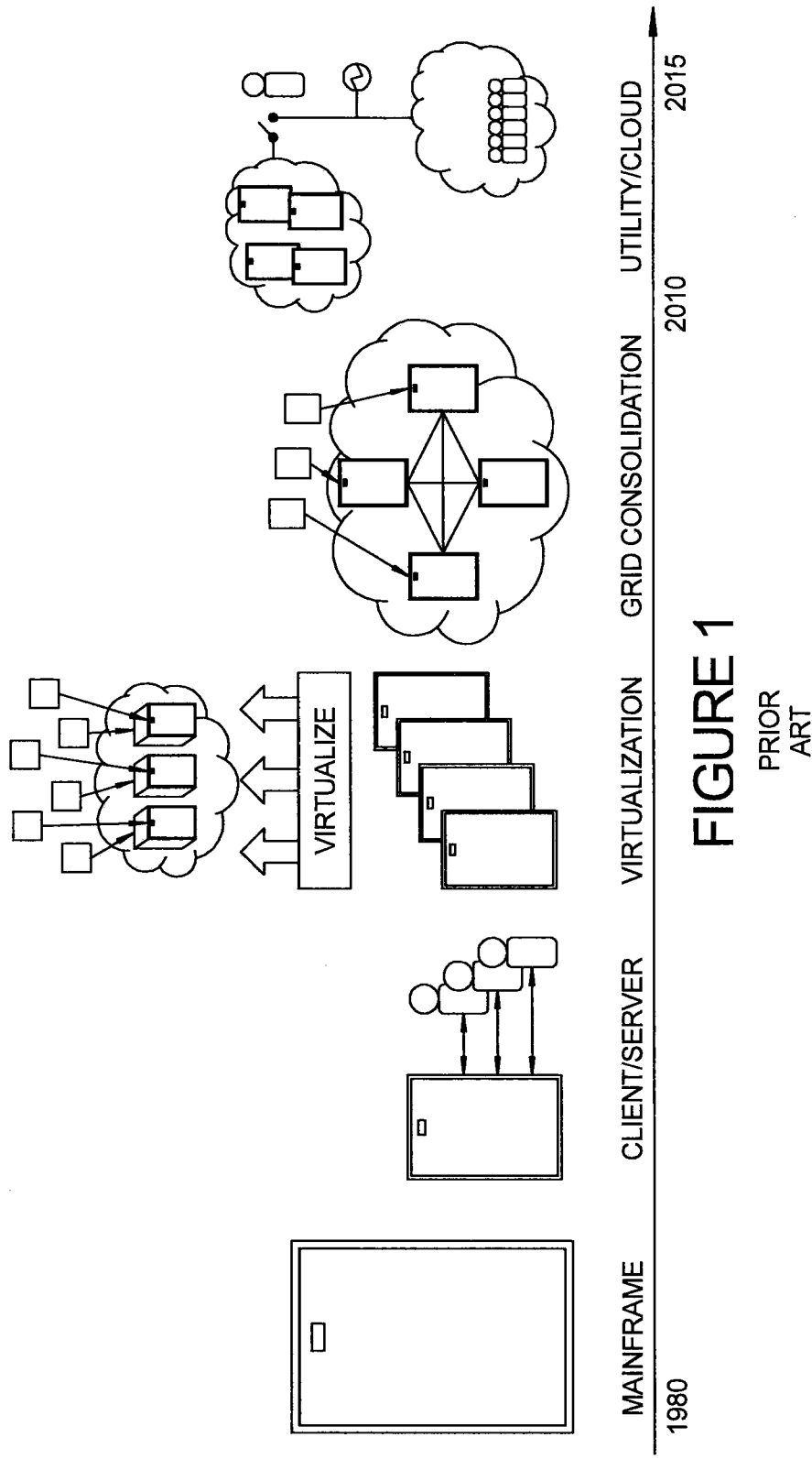
FIG. 1 is a prior art, high level representation of changes that the common data center model has progressed through since its origins in mainframe computing.
Figure 2:
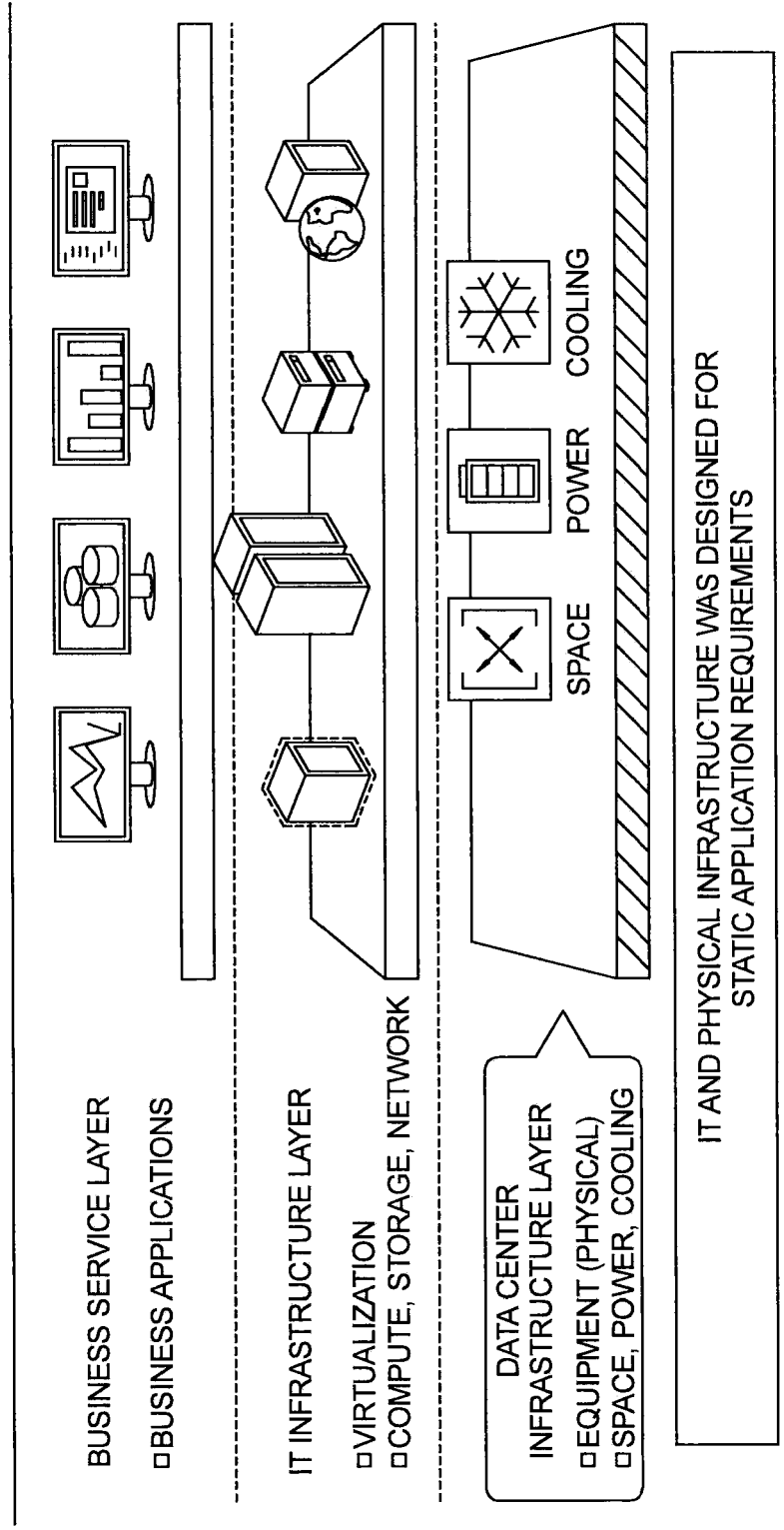
FIG. 2 is a high level representation of one example of the various components that may be used in the various functional layers of a typical, prior art, existing data center.

Example embodiments of a Data Center Infrastructure Management (hereinafter "DCIM") Solution 10 will now be described more fully with reference to the accompanying drawings.

Overview

This section provides a general summary of the disclosure, and is not a comprehensive disclosure of its full scope or all of its features. The DCIM Solution 10 is a modularly expandable family of hardware and software products that are designed to manage all the elements of a datacenter from a central location. In particular, the DCIM Solution 10 includes one or more DCIM hardware appliances (hereinafter simply the "DCIM Appliances") and a suite of software products (hereinafter the "DCIM Software Suite"). The DCIM Solution has the capability to manage Microsoft Windows® servers, Linux® servers, UNIX® servers, storage and serial devices, service processors, rack/environmental sensors, data center power units, cooling units, and power distribution units (PDUs), with all data being gathered by a common collection engine. It allows data center operators to have full access to monitor and control every piece of equipment in the data center.

Until now, to manage a data center, multiple point solutions have been needed. The DCIM Solution 10 brings all of these point solutions into a single product suite. Previously, a plurality of independent hardware devices have been required, such as remote access application and associated hardware such as Avocent's KVM appliance to manage Windows® servers; the Avocent® Advanced Console Server (ACS) to manage Linux®/UNIX® servers, serial devices and iPDU; the Avocent® MergePoint™ Service Processor Manager; the Liebert® Rack Data Unit (RDU) to manage rack and environmental sensors, and the Liebert® SiteLink™ communications interface. Previously, a plurality of independent software applications have also been typically been required, such as: the Avocent® MergePoint Infrastructure Explorer data center management software; the Liebert® SiteScan Web centralized monitoring and control system; Emerson Network Power ASCO PowerQuest™ power interface software to monitor power and cooling equipment; and the Aperture® Vista enterprise software solution. By consolidating multiple software appliances into the consolidated software platform that forms the DCIM Software Suite of the DCIM Solution 10, and multiple hardware appliances into the aggregated DCIM hardware appliance, the DCIM Solution 10 not only frees up physical space on an equipment rack, but the operator's span of control of the data center is enhanced. This allows the data center manager to even more effectively manage and control servers and other computing/storage devices, power equipment, and cooling systems to optimize performance and energy usage.

In addition to the obvious benefits that the DCIM Appliances provide, the DCIM Software Suite makes managing the datacenter easier and even more efficient than what was previously possible. The software modules that comprise the DCIM Software Suite may run on a common host server apart from the DCIM Appliances and may work to provide a complete and accurate view of the data center, while still allowing the user to manage and control every aspect of the data center. The host server receives data from all of the DCIM Appliances throughout the data center via their Manageability Subsystem (MSS) collection engines. By using the DCIM Software Suite modules, the data center manager can tap into the real-time data, view reports, and manage the devices remotely from a rich, web-based, graphical user interface ("GUI").

It should also be noted that the DCIM Appliances and the DCIM Software Suite can be implemented separately and scaled to fit a user's need. By implementing the DCIM Appliances on their own, the user can still access the DCIM Appliances remotely, and therefore access the devices connected to them as well. However, the user would not benefit from the reports and enhanced management abilities that the DCIM Software Suite provides. Likewise, the DCIM Software Suite can be implemented in the data center without the DCIM Appliances, although without the physical connectivity provided by the DCIM Appliances, real-time data collection, monitoring and control are not supported.

DCIM Appliance and DRIP (Hardware)

Figure 3:
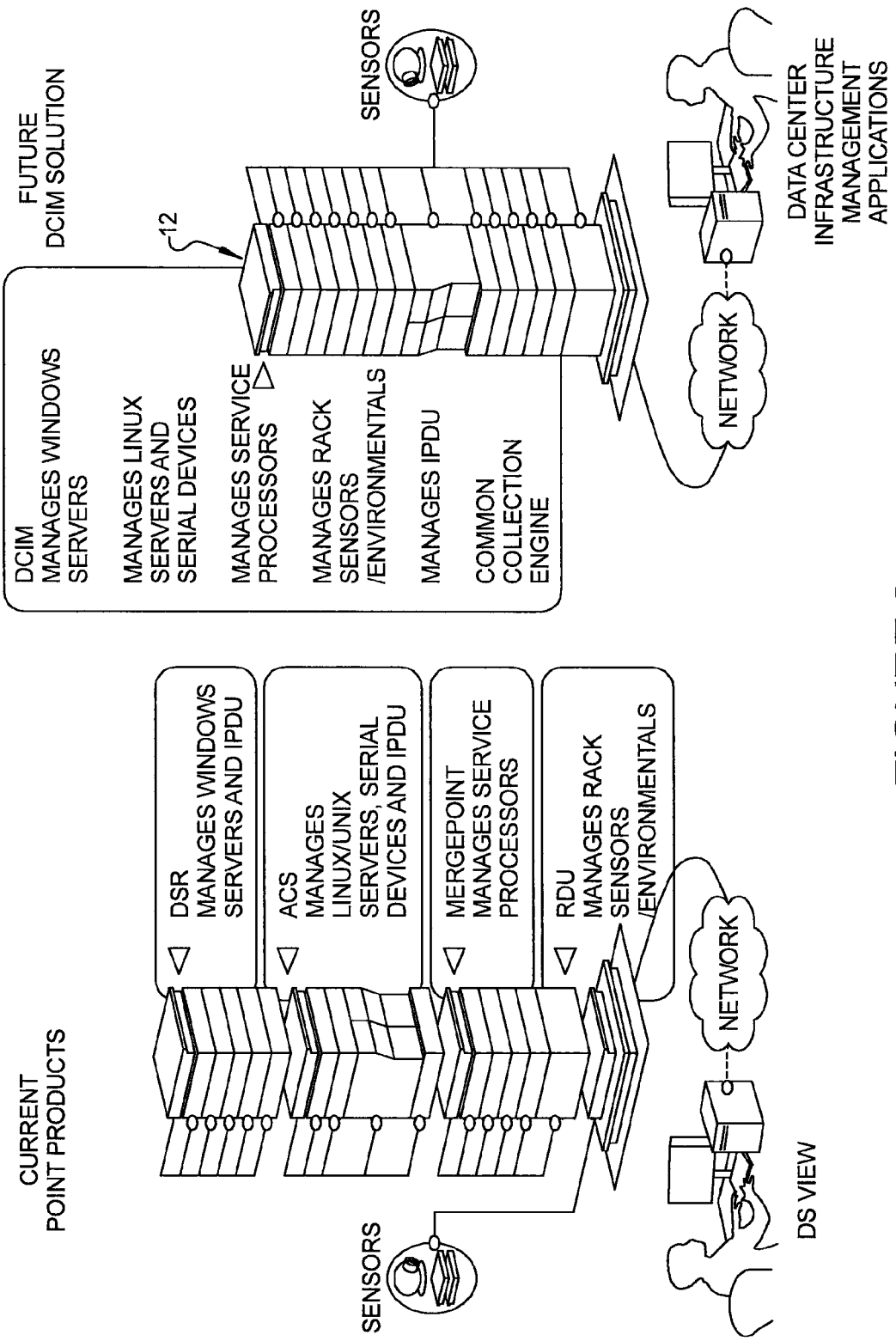
FIG. 3 is a high level representation of one example of a single DCIM Appliance in accordance with the present disclosure being used to perform the functions of a plurality of hardware devices.

A DCIM appliance 12 may comprise one or more hardware appliances that typically reside in selected equipment racks or that may be mounted on a wall within a datacenter. The arrangement of interfaces on the DCIM appliance 12 provides the user with access to various pieces of equipment for control and performance metric collection. As illustrated in FIG. 3, the single DCIM appliance 12 consolidates the functions of several previous products into one piece of hardware. The DCIM appliance 12 may replace the existing Avocent® DSR® switches, Avocent® Advance Console Server (ACS), MergePoint Service Process Manager, (SPM), and the Liebert® Rack Data Unit (RDU) products, and consolidate all of their functionality into one or more hardware appliances. A base embodiment, of the Appliance 12 termed the "DCIM SP", is targeted to replace the existing service process manager (SPM) hardware. The DCIM SP can have two specific port configurations, one with 24 IP ports and another with 40 IP. Both versions can include eight dedicated serial ports. For each, the IP ports can be isolated from the network interface ports and function as a layer two switch. This arrangement preserves the configuration of the current SPM. The numerous IP ports and the eight dedicated serial ports provide an appliance that can service an entire rack of service processors and also provide control of serial based switches and power strips in the rack. In addition to the two physical port SPM variants, there is a logical version that has only the main network ports and does not have any rear panel ports, the DCIM SP Logical.

In addition to the DCIM SP embodiment, the DCIM appliance 12 may have three higher-end embodiments labeled the "DCIM Branch 8", the "DCIM Entry", and the "DCIM Enterprise". This higher-end group of embodiments of the DCIM Appliance 12 provides auto-sensing ports that can automatically select between IP or serial connections. The DCIM Branch 8 does not have RDU connections while the DCIM Entry and DCIM Enterprise devices do. The RDU interfaces on the DCIM Entry and DCIM Enterprise appliances mimic the main connectivity of the RDU appliance and allow similar functions to be included on the higher-end DCIM devices. The higher-end DCIM appliance 12 embodiments may also have the ability to interface with an IQ module providing traditional KVM functionality. This IQ module, called a "Digital Rack Interface Pod" (DRIP), provides digitization of analog video along with keyboard and mouse control and virtual media access.

The key functions of the DRIP are:

Providing USB and PS/2 ports for device keyboard and mouse;

Digitizing analog video data and sending it to the DCIM Appliance;

Connecting to a server's Service Processor for transmitting IPMI data to the DCIM Appliance;

Enable access to virtual media; and

Enable Smart Card support.

In order to support the various hardware platforms, an appliance host software platform is provided. The appliance host platform may be based on the Linux® vServer patch and functions as an OS virtualized platform. This allows Linux® operating system based applications to run with minimal changes on top of the DCIM appliance 12 host platform. Building the DCIM appliance 12 in this manner minimizes the changes necessary to combine the individual technologies into a single appliance. It also facilitates groups being able to concentrate on their core function without needing to know the details of the DCIM appliance 12 host platform.

A highly desirable feature of the DCIM appliance 12 software architecture is that it makes the finished devices look like a single cohesive appliance, even though they may be constructed from several underlying disparate software applications. To achieve this, the host system may be set up to provide several system functions that provide a gateway between the external user and the internal guest applications. These include licensing, authentication, authorization and auditing (AAA), and user interfaces. These functions take the external input and map it on to the correct application without the user requiring any knowledge of the underlying architecture. For example when a user authenticates to the DCIM appliance 12 the AAA function may inform each of the guest applications that the user is valid. The user does not need to authenticate to each guest application. Additional host pieces may include things such as the Linux® kernel, base file system and hardware component driver support. Each of the DCIM appliance 12 may also host a manageability subsystem (MSS) software engine (to be discussed in connection with FIG. 5).

In summary, at least six different configurations for two DCIM platforms, platforms "A" and "B", are shown in the following table.

| Function\Platform | DCIM SP I | DCIM SP II | DCIM SP Logical | DCIM Branch 8 | DCIM Entry | DCIM Enterprise |
|---|---|---|---|---|---|---|
| Com Express | Atom D410 | Atom D410 | Atom D410 | Atom D410 | Atom D410 | i7-620LE |
| Memory | 4 GB DDR2 | 4 GB DDR2 | 4 GB DDR2 | 4 GB DDR2 | 4 GB DDR2 | 8 GB DDR3 |
| HDD | 250 GB | 250 GB | 250 GB | 250 GB | 250 GB | Dual 2TB |
| Dedicated IP Ports | 24 | 40 | 0 | 0 | 0 | 0 |
| Dedicated Serial Ports | 8 | 8 | 0 | 0 | 0 | 0 |
| Autosensing Ports | 0 | 0 | 0 | 8 | 32 | 40 |
| RDU Functions | None | None | None | E-Link and RS-485 | All | All |
| MSS Features | Yes | Yes | Yes | Yes | Yes | Yes |
| Power Supply Wattage | 125 W | 125 W | 125 W | 125 W | 125 W | 125 W |
| Power Configuration | Single/Dual | Single/Dual | Single/Dual | Single | Single/Dual | Single/Dual |
| Enclosure | Shallow | Shallow | Shallow | Extended | Extended | Extended |

DCIM Software Suite

Figure 4A:
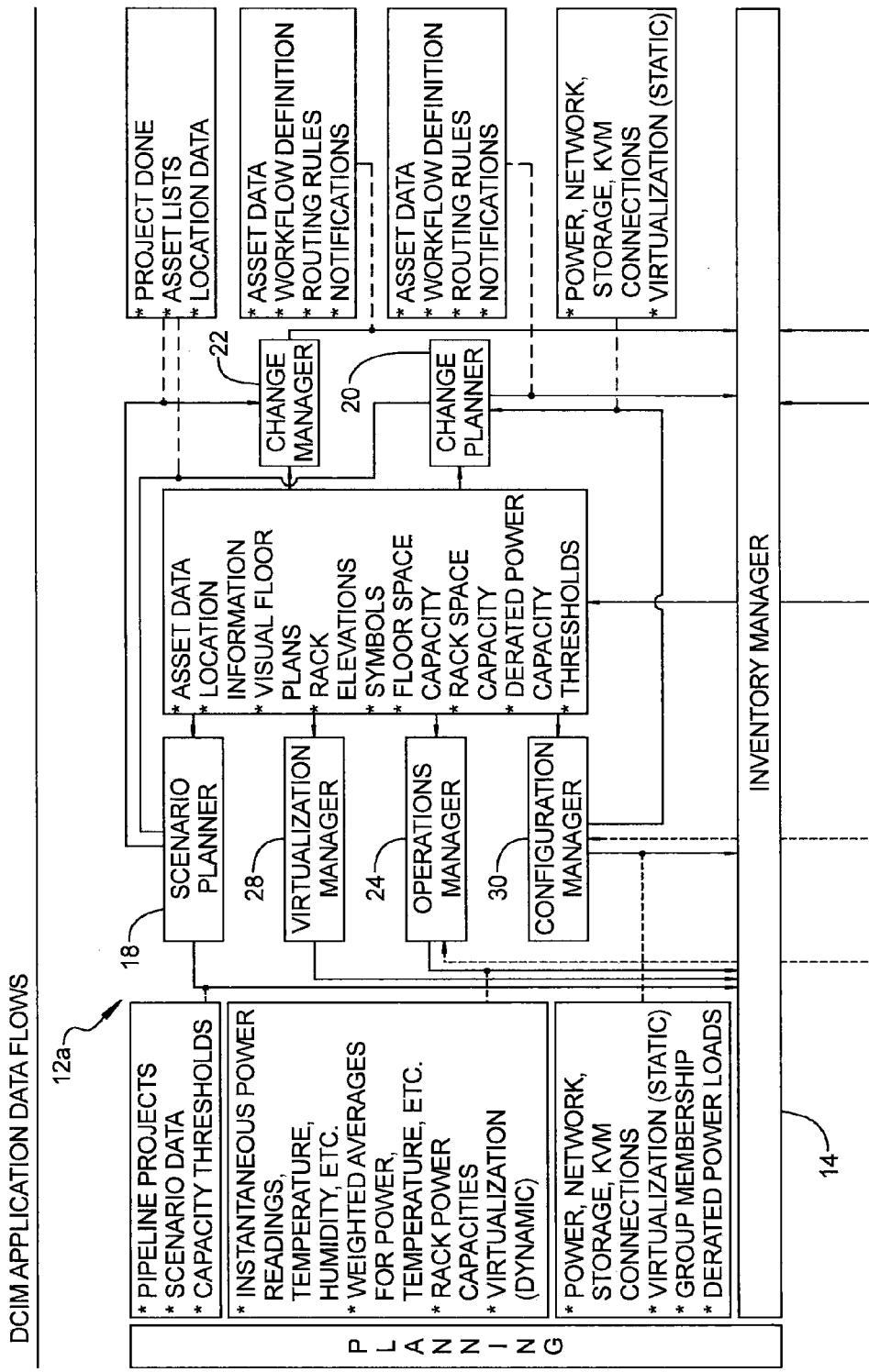
FIG. 4 is a high level diagram of exemplary modules that may be used to form a DCIM Software Suite of one embodiment of a DCIM Solution of the present disclosure.

A DCIM Software Suite 12*a* of modules is modular, expandable and designed to make the operation, management, configuration or expansion of a datacenter seamless and simple. One example of the DCIM Software Suite 12*a* of modules is shown in FIG. 4 and may include: an Inventory Manager 14, a Facilities Manager 16, a Scenario Planner 18, a Change Planner 20, a Change Manager 22, an Operations Manager 24, an Event Monitor 26, a Virtualization Manager 28 (and potentially a Rack Power Manager, and a Configuration Manager 30). These modules integrate seamlessly with one another and provide a rich user interface, with the ability to drag and drop items, show high-fidelity images of assets and reported data, and compile user-specific views with combinations of available facilities.

The DCIM Software Suite 12*a* is flexible enough to accommodate the preferences of the system administrator in a number of different areas, from the operating system and database to the web browser interface. The software modules can be installed on Microsoft® servers, Linux® servers, or Sun® servers, and possibly on other brands of servers. Microsoft® SQL and Oracle® databases are supported. To access the software modules, various commercially available operation systems and web browsers are supported.

For administrators who use existing products of Emerson Network Power or the Avocent® Corporation, for example the Aperture® Vista® data center resource management system, the Liebert® Site Scan® centralized monitoring and control system, or Avocent® MergePoint™ Infrastructure Explorer software (AMIE), the DCIM Software Suite 12*a* supports the migration of data. This data may include all assets and plan data, associated projects, and symbols libraries. The import may be manually triggered but will not necessitate the manual mapping of any asset, placement, plan or project data from AMIE to the modules of the DCIM Software Suite. The individual DCIM Software Suite 12*a* software modules are described in detail in the pages to follow.

DCIM Inventory Manager Module 14

The Inventory Manager module 14 manages DCIM records, which constitute the data center inventory of equipment. Often, data center managers and site technicians manage equipment lists through a variety of means such as spreadsheets, documents, drawing files, finance systems, bills of lading, etc. These are not ideal methods, and tend to be ad-hoc in format, inaccurate, and frequently out-of-date. They also do not provide timely access to information about where physical equipment is located and its purpose. The DCIM Inventory Manager module 14 replaces all of these ad-hoc methods with a system that gives a clear picture of the entire inventory of the data center, with equipment counts of IT assets such as servers and switches, and critical infrastructure equipment like power distribution units ("PDUs") and uninterruptible power supplies ("UPSs"). It allows users to quickly see where equipment is located and gives a gross total of power and space usage.

To do this, the DCIM Inventory Manager module 14 may rely on import software capabilities and specialized views, for example: 1) Import capability to extract equipment records from various sources, and combine information from these sources into a complete data set; 2) Geography Views, which allow users to provide the global location of data center installations and drill down to show more detailed location views, such as campus views, regional views, pictures of buildings, etc.; 3) Textual and Graphical Inventory Lists, which are textual views for "placed" and "un-placed" inventory (items which have not been assigned a location); 4) Data Center Portfolio View, which lists the data centers being managed by the system; 5) Floor Plans and Elevation Views for "placed" inventory (items which have been assigned a location); 6) Workspaces, which allow users to combine graphic and data elements from other views to give them a "dashboard" of critical information which they can reference at a moment's notice; and 7) Layers, which allow users to see information from other applications within the Inventory Manager graphic drawings.

The DCIM Inventory Manager module 14 is able to create, update, and delete all represented objects. These objects include:

IT Spaces—areas where IT equipment is located and housed, and at a more granular level, where equipment is installed.

Floors—areas which contain one or many data center spaces, and correlate to a floor in a building.

Data Centers—areas that are designed to house and run IT equipment. Typical data centers have raised floor spaces as well as dedicated power and cooling equipment.

Spaces—regions of a data center floor in which IT equipment is directly installed. Typical data center spaces have raised floors and racks to house equipment, and are secured from unauthorized entry.

Zones—geographic areas of the data center as defined by the customer, which allow the tabulation of capacity and resource usage within areas of the overall data center. In our definition, a zone is one contiguous space within the data center floor.

Other spaces (walkways, free space)—spaces which, when deducted from the total data center space allow for the calculation of usable data center space.

Enterprise—Information about the Enterprise is tracked to give context for the entire data center portfolio and the teams that manage them. Enterprise information may be tracked at the global level in the software.

IT Equipment—may include all equipment used for the direct purpose of data processing, communications, and storage, and the equipment used to house them. This includes: racks, benches, shelves, data closets; servers, network appliances; symbols, placeholders; and sensor equipment.

Critical Infrastructure—may include all devices, which support the cooling and power distribution for the data center space, including: local utility entrance meters, surge protection devices, transformers, switchgears (HV/MV/LV), generators, uninterruptible power supplies (UPSs), energy storage devices & systems (e.g. batteries, flywheels, fuel cells), power disconnects (e.g. circuit breakers, switches/power-ties), static transfer switches, floor mount PDU systems, power panels, remote power panels, busway power distribution, commando sockets, rack PDU, solar arrays, cooling towers, chillers, pumps, economizers (water/air), floor mount CRAC, in-row CRAC, condensers, heat exchangers, and water reservoirs (tanks).

DCIM Configuration Manager Module 30

The DCIM Configuration Manager module 30 expands the management of DCIM records that are provided by the DCIM Inventory Manager module 14. The DCIM Configuration Manager module 30 consumes the capabilities of the DCIM Inventory Manager module 14, extending them to manage relationships between chosen assets. These relationships may include, without limitation, connections, logical groups and redundancies. To do this, the DCIM Configuration Manager module 30 may incorporate various features, such as:

Connection Views, which allow users to details of the connections between any placed assets. This may include topology, end-to-end trace, dependency and redundancy;

Panel Schedules, which allow users to view details of a panel and the breakers within that panel;

Alerting capabilities, which allow a user to specify a threshold for a plan, group or assets and alert on the consumption against that threshold;

Customizable views, which allow a user to customize the views of the application data that they would like to use and navigate; and Web Services Interface, which allows a user to manipulate the application data from an external software entity.

DCIM Facilities Manager Module 16

The DCIM Facilities Manager module 16 provides complete performance utilization and event management capabilities for critical infrastructure equipment. It provides realistic, virtual views of the equipment and racks on the data center floor and surrounding equipment rooms, as well as underlying electrical one-line schematics of the power system and piping and instrumentation diagrams of the cooling system. It may also provide equipment maintenance features to assist in maintenance tracking, scheduling and equipment commissioning. By providing a system view of power and cooling infrastructure as designed, the DCIM Facilities Manager module 16 allows the user to view the power consumption and cooling capacity (both in-use and stranded) of each device, or at the system level. In addition, it lets the user reserve blocks of load on the power and cooling systems, and project the power and cooling capacity needs into the future, based on historic capacity use.

The Facilities Manager module 16 may provide, both textually and graphically, a number of useful views that allow the user to better understand and manage the data center infrastructure. The DCIM Facilities Manager module 16 may display floor plans, electrical diagrams, air distribution, and piping and instrumentation diagrams. The DCIM Facilities Manager module 16 may provide real-time performance status of individual elements or groups of infrastructure equipment. Each item in the diagram allows the user to initiate the following actions or control operations, if supported by the equipment:

Turn on/off the specific piece of equipment/device (if applicable);

Change user configurable items (e.g. set-points, labels); and

View detailed information for each piece of equipment/device.

In addition to primary view diagrams, the DCIM Facilities Manager module 16 may have at least three separate dashboard views to give the user an overall picture of real time operations in the data center infrastructure. An "Industry Efficiency Dashboard" may display the standard efficiency metrics of the data center's energy consumption (e.g. PUE/DCiE). A "Utilities Consumption Dashboard" may display the total power load (kW), total cooling load, water consumption if applicable, and the overall utilities cost. A "Capacity Dashboard" may display a breakdown of the aggregated capacity of the data center equipment per type (e.g. the current capacity of all floor mount PDUs), as well as a breakdown of the stranded capacity of the data center power and cooling systems.

The DCIM Facilities Manager module 16 also provides significant scalability, for example supporting up to 5000 critical infrastructure equipment and instrumentation devices (or possibly more), with an approximate number of 200 data points each, in one example. The equipment data (all parameters other than events) may also be polled at a minimum of every five minutes. Some examples of this data may include temperature, percentage load of a UPS, and circuit breaker state just to name a few example metrics.

Scenario Planner Module 18

The DCIM Scenario Planner module 18 provides the ability to build and compare cost effective scenarios of future resource usage in the data center. It may utilize information from data center infrastructure management applications and real world measurements to map an accurate history of resource usage, and project future trends of growth and decline. With the DCIM Scenario Planner module 18, data center managers and capacity planners can determine the best course of action. Whether it means that installations should be decommissioned and consolidated, or new installations be built, the DCIM Scenario Planner module 18 allows the customer to compare and contrast different scenarios of future data center use. The effect of technology updates, increased density within the data center space, upgrades of the critical infrastructure for more efficient energy use, and gauging demand on IT can be compared to build a plan of action that meets service levels at the lowest possible cost. Once the course of action has been determined, the DCIM Scenario Planner module 18 assists in the communication of the plan to management. Software Capabilities that may be included in DCIM Scenario Planner module 18 include, without limitation, one or more of the following:

The ability to collect and understand past trends of aggregated global data center infrastructure resources;

The ability to project past aggregated usage trends into the future, to predict base infrastructure needs globally;

The ability to conduct "what-if" scenario planning for infrastructure needs, and to assess the impact of data center moves, adds, decommissions and consolidations; and The ability to establish a workflow process for project pipeline management, including refinements by technical experts and system owners, and approvals by business managers.

DCIM Change Planner Module 20

The DCIM Change Planner module 20 allows the users to plan and execute changes in the data center infrastructure. To do this, the DCIM Change Planner module 20 may rely on:

Plan views, allowing users to see details of the planned projects;

Timelines, allowing users to see changes planned for a chosen asset throughout the project; and Alerting capabilities, allowing users to be notified when a task is completed.

The DCIM Change Planner module 20 allows the user to create any number of projects, manage those projects and navigate through them. The user can assign a name, tag, description, target completion date and owner to the project, and can assign individual tasks to the project as well. Once a project has been created its details may be visualized in a calendar format with further details made available for any selected project or tasks. The project can be edited by moving project dates, deleting tasks or adding tasks and the project can be deleted. In addition to specific tasks, the user can assign generic tasks, which do not relate to any particular placed asset in the module. The DCIM Change Planner module 20 also allows the user to assign and view dependencies to other tasks in the project. With the capability to create and manage multiple projects, the possibility arises that there may be conflicts between projects, but the DCIM Change Planner module 20 allows the user to view the conflicts and their severity, and resolve the conflict by changing the parameters of the projects.

Once a project is created and tasks assigned, the DCIM Change Planner module 20 allows the user to view a timeline of the project along with visualizations of the changes associated with any assets affected by the project. The user can see a view of the chosen asset (e.g. a rack), with the assets shown in its various states of change that are scheduled to happen during the lifespan of the project. The DCIM Change Planner module 20 may also display a view of the work to be carried out during a project, colorized by chosen dates, which allows a timeline to show the IT person what is happening on a given date for any chosen assets.

For a given project, the DCIM Change Planner module 20 also allows the user to record all project activity and notify any affected personnel of the activity. A user is notified via email once their designated task or project has been created, edited, has a conflict or is tagged as completed. In addition, the user can create customized reports, import project information in a standard format from an external source, and export project information to PDF or spreadsheet for external use.

DCIM Change Manager Module 22

The DCIM Change Manager module 22 expands the planning and execution capabilities of the DCIM Change Planner module 20 to impose predefined processes or workflows on projects and communicate progress and decisions to project members. To do this, the DCIM Change Manager module 22 may rely on the following software capabilities and specialized views:

Template Workflow Processes that allow a workflow designer to design and publish workflow processes to be used by future projects.

Interaction with DCIM modules, which allows the workflow process to interact with DCIM modules to verify that certain required actions have been completed.

Supports integration with third party IT systems to allow a designer to configure an interface to allow an external source to interrogate the application data and initiate workflow processes.

Human Interaction in a workflow process, which allows a user to interact with a process that was created from a template.

The DCIM Change Manager module 22 provides the ability to create a project template with user defined high level actions supported by lower level tasks provided by the DCIM Change Planner module 20. Project templates may be used to create projects when needed, where the project may follow the template pre-defined steps to completion. A template may contain, without limitation:

Pre-defined high level tasks related to the installed Inventory Manager modules (e.g. "Move server" or "Add connection").

User-defined task categories (e.g. "Move", "Add").

Trigger points to existing workflow templates.

Once a template is created the user can assign roles for use in the template. The user assigns a name, description, and tag to a role, and can assign other users. The DCIM Change Manager module 22 allows for users to be assigned to multiple roles if necessary. In addition to roles, users can create workflow procedures and assign a name, description and tag to each workflow. Once a workflow is created, steps can be added (whether user defined, or predefined) and specific users or roles can be assigned to each step. To add further detail, the user can define rules, such as entry and exit criteria, to each step. Steps may be linked together to define a progression and sub-processes can be created through certain steps.

Once the user has a workflow set up, he/she can simulate a "run" of the execution to identify any errors and validate the workflow. The user may also want to set up customized notifications for various workflow events. The DCIM Change Manager module 22 allows the user to do this, and will propagate notifications to the participants when a task begins, completes, or when any other workflow event occurs.

DCIM Operations Manager Module 24

The DCIM Operations Manager module 24 combines real-world information with managing the data center infrastructure configuration. It provides interfaces to measure performance and utilization across the data center infrastructure and to reveal current available headroom in racks such that the appropriate placement of equipment can be achieved. The DCIM Operations Manager Module 24 may connect to real time data feeds (for power and temperature) from a Manageability Subsystem (MSS) service to compare and validate the performance guidelines and design criteria established in the Configuration Manager module 30 capabilities.

The DCIM Operations Manager module 24 may also be used to optimize power, cooling, and space capacity to bring about overall optimization of data center infrastructure resources. The business problem this module solves is around the management of power and cooling. Large buffers of power and cooling are typically maintained by data center managers to protect systems from outage due to power spikes and periods of increased usage. The amount of buffer to reserve is typically not managed efficiently. Reduction of these buffers allows better utilization of resources. For example, more equipment may be located in one or more equipment racks while sufficient power and cooling needs are still met for all equipment items.

One important feature of this product is that it provides a natural and elegant approach to viewing monitored information about the data center—of which there is a large amount generated by many systems in many different formats. The result of crunching all of this data and seeing it in a usable form makes possible a more accurate understanding of the operation of the data center environment, a better understanding of the true cost of energy use, maximization of the investment in the data center, and ensuring continued 24/7 operations for IT.

The software capabilities are inherited from those defined for the DCIM Configuration Manager module 30 and the DCIM Inventory Manager module 14. The DCIM Operations Manager module 24 adds new features to the DCIM Configuration Manager module 30 capabilities as listed herein. There may be, however, additional software facilities defined for the DCIM Operations Manager module 24 such as, without limitation:

Dashboard for monitoring real-time data feed.

Additional visualizations to show temperature sensor output, and cooling parameters such as airflow.

DCIM Event Monitor Module 26

The DCIM Event Monitor module 26 provides an easy-to-understand system for managing alarms. It provides a single, unified view to monitor alarms for critical infrastructure equipment across the user's entire enterprise. Relevant information is presented in a simple, graphical manner, making it easy to understand and respond quickly. The DCIM Event Monitor module 26 allows the user to, without limitation:

Maintain service level agreements (SLA's).

Keep the business critical IT infrastructure available and online.

Maintain critical infrastructure system redundancy.

Acknowledge and verify that actions have taken place.

DCIM Virtualization Manager Module 28

The DCIM Virtualization Manager module 28 provides tools to manage virtual infrastructure in a data center. It helps to map physical machines with virtual machines, manage the virtual machines and group the virtual machines for ease of management. The DCIM Virtualization Manager module 28 may relay the information to the DCIM Operations Manager module 24 for interfacing with virtualization management servers (e.g. VMware Virtual Center Management Server). The DCIM Operations Manager module 24 may then auto-discover host machines and virtual machines, relaying this information back to the DCIM Virtualization Manager module 28. With this information the user is able to specify the synchronization schedule of virtualization infrastructure information between virtualization management and virtualization management servers on periodic, pre-defined time intervals. The user may also initiate synchronization on a demand basis from the DCIM Virtualization Manager module 28.

With the virtualization inventory synchronized, the user is able to view the inventory in a graphical format. The DCIM Virtualization Manager module 28 may depict the virtual machines graphically against the physical inventory or servers to show which virtual machines are housed where. In addition, the DCIM Virtualization Manager module 28 may provide a cluster view (showing the groups of virtual machines in various clusters), a virtual list of servers with associated virtual machines, and a search feature allowing the user to find the specific virtual machine, cluster or server that he/she wants to manage. When the user selects the correct virtual machine, the Virtualization Manager module 28 provides the ability to access the virtual machine console by launching the virtualization provider's Remote Console, a Web browser or a RDP from a virtual machine.

Additional Details of DCIM Solution 10

Figure 5:
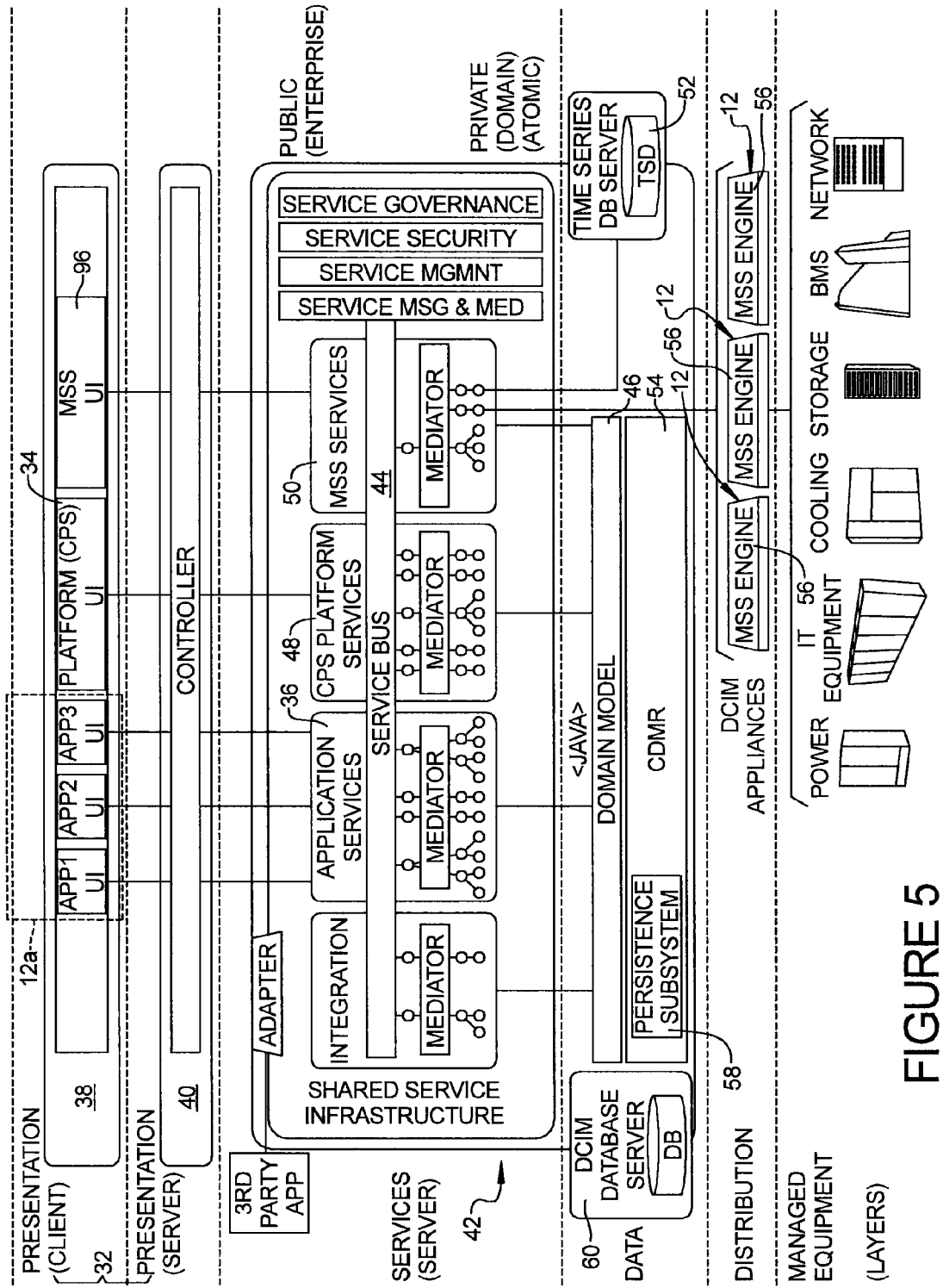
FIG. 5 is a high level diagram of one example of the DCIM Solution architecture.

Referring to FIG. 5, various components of the DCIM Solution 10 can be seen. The architecture of the DCIM Solution 10 contains the following high level components. Each component will be described in more detail in the discussion below.

Presentation UI 32—These components represent the human interface for individual applications and for the platform. A Common Platform 34 contains a web-based Console Framework that allows individual applications and the platform to plug-in user interface components. The Presentation UI 32 consumes public interfaces exposed by a Services layer 36 that provide the actual business functionality. Logically, the Presentation UI 32 may be broken into two layers: a client layer 38, typically resident within a web browser and representing the "View" in a Model-View-Controller architecture, and a server layer 40, typically representing the Controller.

Enterprise Service Bus (ESB)—An ENP Common Platform 42 contains an Enterprise Service Bus 44 that provides a container for Business Services and provides for intelligent routing of messages between services. The architecture presumes that communications between the Presentation UI 32 layer (specifically, the controller 40) and the ESB 44 will be SOAP/HTTP, although other transports may be used based on specific application design requirements.

Application Services 36—These may be individual and/or composite services that provide product application functionality. A service composition is an aggregate of services collectively composed to automate a particular task or business process. These services 36 can be made up of both private and public services. Public services are exposed on the ESB 44 and available for other applications to consume. These application services 36 use a Domain Model 46 (for example via Java) to access business objects specific to the product domain.

Common Platform Services 48—These are utility services provided as part of the ENP Common Platform 42 and may be either individual or composite services. The ENP Common Platform 42 provides these services which are likely to be used by any product and may include services such as authentication, authorization and auditing. These services are configurable such that a Product Line Architecture PLA may select which services to include for a given PLA. For maximum extensibility, these services should be data driven such that they are also extensible by adding domain specific knowledge (e.g. a new event type unique to a given domain).

Manageability Subsystem (MSS) Services 50—These are composite services that provide for management (e.g. Discovery, Data Acquisition, Command & Control) of managed elements (or managed devices) via a distributed real-time framework. The MSS Services 50 interacts with the DCIM appliances 12 to perform data acquisition and store acquired data in a Time Series Database 52 and a Common Data Model Repository CDMR 54.

Time Series Database (TSD) 52—The time-series database 52 operates to persist telemetry data sent from the MMS Services 50.

DCIM Appliance 12—The DCIM appliance 12 (or appliances 12) form a hardware appliance that is the touch point to the managed equipment or managed devices. Each DCIM appliance 12 can be loaded with several software applications including KVM, Serial, Service Processor and an MSS Engine 56 for data acquisition.

MSS Engine 56—The MSS Engine 56 may be a software component that can be deployed on each DCIM appliance 12 to acquire metric data and perform management (e.g. Discovery, Data Acquisition, Command & Control) on managed equipment being handled by each DCIM appliance 12. The MSS Engine 56 feeds data to the MSS Services 50 for storage in the Time Series Database 52 and the CDMR 54.

Managed Equipment (or Managed Devices or Managed Components)—Represents an entity (e.g. a "device") that is addressable and can be managed (i.e., controlled in some way) and/or monitored.

Domain Model 46—The Domain Model 46 provides a common definition of domain concepts across all applications (e.g. a shared, extensible library of domain classes that allow for application specific customization). In one example, the Domain Model 46 may be represented as native Java objects. It also delegates manageability knobs and dials type operations to the MSS Services 50.

Common Data Model Repository (CDMR) 54—The CDMR 54 forms a repository that is responsible for creating and persisting the Domain Model objects. The CDMR 54 hides the complexity of initializing domain objects and hides a persistence subsystem 58.

DCIM Datastore 60—A DCIM Datastore 60 may be a SQL database that persists the defined domain objects and other configuration information associated with these domain objects. The DCIM Datastore 60 may be in communication with the persistence subsystem 58.

Integration Services 62—Composite services that are deployed to support integration with 3$^{rd}$ Party Applications.

3$^{rd}$ Party Applications—External applications that can be integrated with the ENP Common Platform 42 (e.g., Hewlett-Packard OpenView software, CiscoWorks LAN management solution tools, the EMC Corporation EMC Smarts Application Discovery Manager (ADM)).

Technology Alliances—development of key technology alliances (internal to Emerson and external) to tightly integrate and enable a closed loop control system. Technical alliances with:

Emerson Network Power Products: Liebert Power and Cooling products to embed DCIM components to within managed devices and elements allow discovery, monitoring and control of various Liebert products.

External technology alliances (for example: Cisco, EMC and Vmware to embed DCIM components in managed devices and elements to provide detailed information on server workloads and integrate Power & Cooling consumption.

All components can be deployed on the same server, but the DCIM Solution 10 is flexible enough to allow major components to be placed on separate servers (e.g. Client, Application Server, Database Server, Report Server, etc.) for scalability and redundancy purposes.

The following is a further discussion of various components of the DCIM Solution 10.

Domain Model/CDMR

Figure 6:
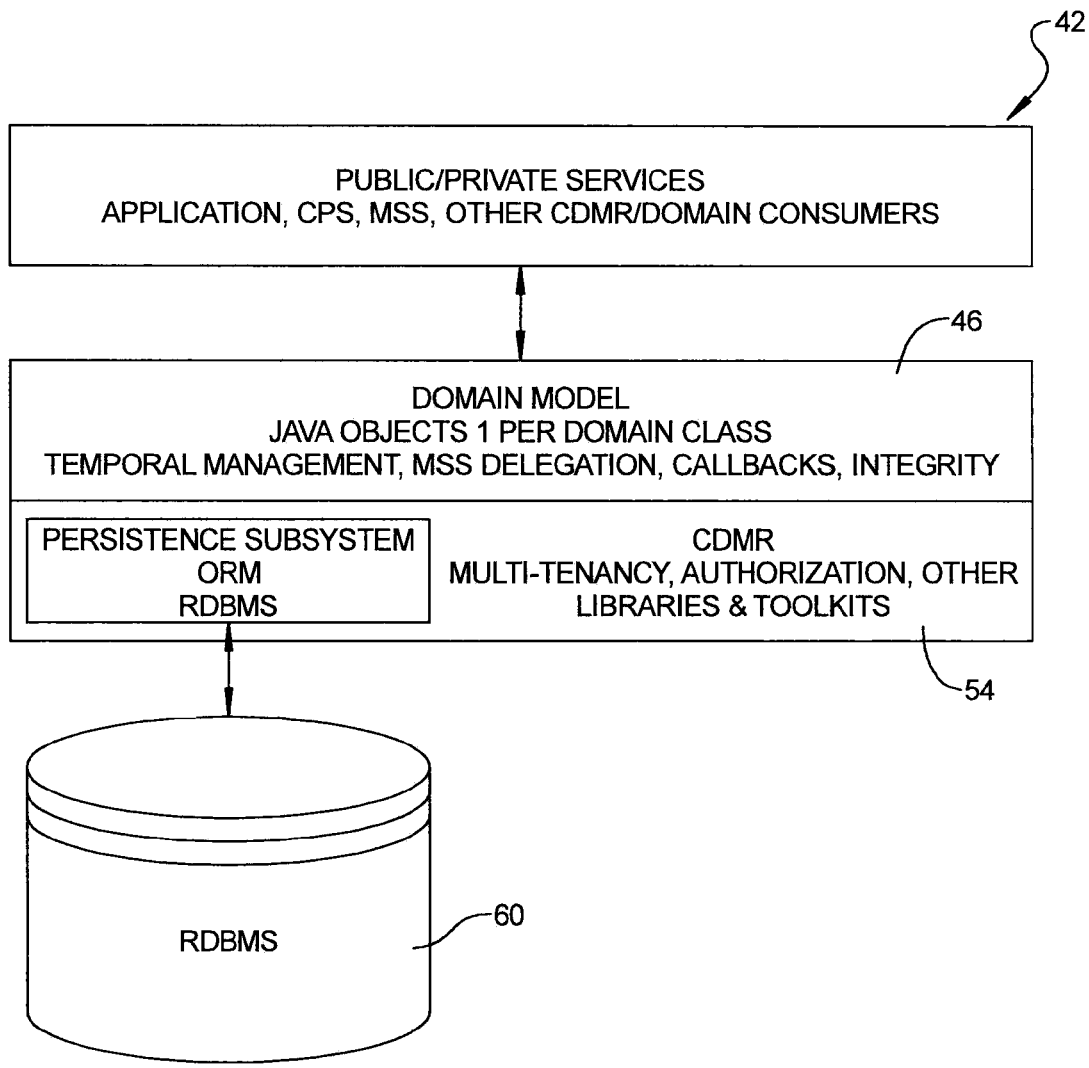
FIG. 6 is a high level diagram of showing the relationship between the Public/Private services and the DCIM Solution's Domain model and CDMR.

Referring to FIG. 6, the Domain Model 46 may be viewed as a collection of Java classes that represent data center infrastructure entities—and the context in which those entities exist. In addition, the Domain Model 46 may represent users, software licenses and other associated data center infrastructure management (DCIM) entities. These can be viewed as the "facts". These facts are used by applications and services.

A common data model may be shared across all of the DCIM application modules 14-30. Individual products often extend the DCIM product line's shared, common data model. The CDMR 54 maps Java class instances to persistent storage (in a relational database, such as the DCIM datastore 60), enforces authorization, segregates tenants, checks integrity constraints, etc. A variety of cross-cutting concerns can be addressed by the CDMR.

The Domain Model 46 is the collection of domain classes used to represent entities (under management), relationships amongst entities, and policies about entities and so on. The Domain Model 46 establishes the conventions for representing all of the known 'facts' within the DCIM domain. Then, these 'facts' are shared across all products within the DCIM product line.

Figure 7:
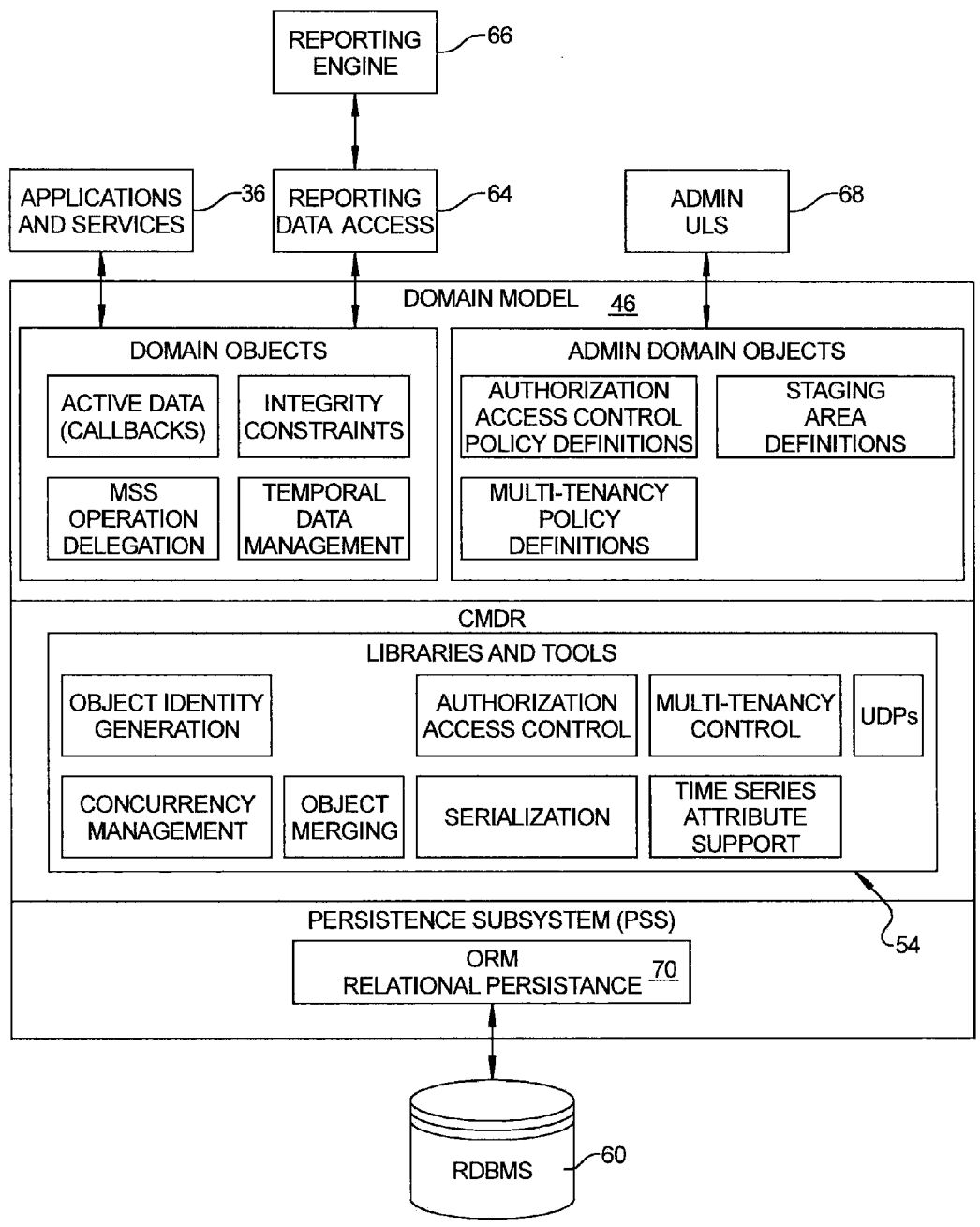
FIG. 7 is a high level block diagram showing the distinction between the domain objects that are used across domain models and DCIM domain objects.

Referring to FIG. 7, the CDMR 54 presents supervision control and data acquisition (SCADA) solution for the entities under management. This interface is tightly coupled to domain objects. The CDMR 54 supports an arbitrary set of domain classes (which constitutes the Domain Model). The CDMR 54 coordinates concurrent object modifications, supports domain object persistence and provides a number of other support services (like object identifier—OID generation conventions/mechanisms). In addition, the CDMR 54 offers a suite of facilities that can be called upon by domain class developers to address cross cutting concerns like authorization resolution/enforcement, multi-tenancy checks, volatile attribute access, etc.

Figure 8:
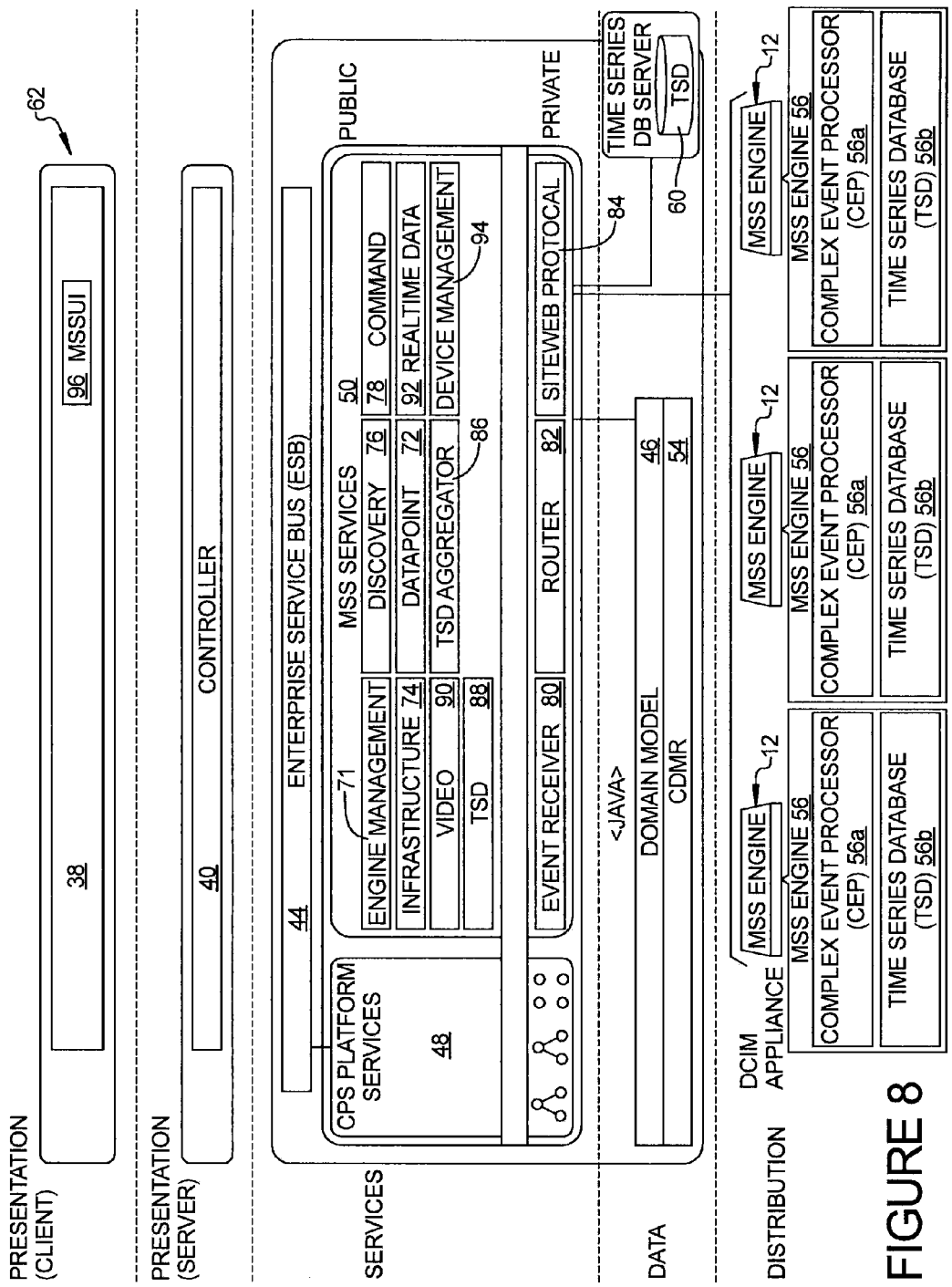
FIG. 8 is a high level block diagram of one example of an architecture showing an interaction of MSS components with the Domain Model and the MSS Engine/DCIM Appliance.

For most purposes the DCIM Domain Model 46 hides a Manageability Subsystem (MSS) 62 that is formed by the MSS Services 50 and the MSS engines 56 (to be discussed further in connection with FIG. 8). Command and control operations are initiated through the Domain Model 46 and are delegated to the MSS subsystem 62 as needed.

Under the covers of the DCIM Domain Model 46, the MSS Engines 56 may reuse the CDMR-supported DCIM Domain Model 46. This obviates the need to design a distinct representation of domain model information—and the need to then map that into (and out of) the CDMR 54 supported DCIM Domain Model 46. This also allows the MSS Engines 56 to reuse the CDMR 54 for final (closest to the device and most recent) checking of authorization policies, multi-tenancy policies, integrity constraints and so on. To support multiple network operation centers, each and every CDMR 54 instance may participate in an eager (ASAP) eventual consistency regime.

The above discussion explains a distinction between the domain objects that are used across domain models and DCIM domain objects. Above, the domain objects that apply across domain models are called 'admin domain objects'. Essentially, these are the domain objects that describe some aspect of other domain objects—e.g. authorization policies (about domain objects), multi-tenancy policies (about domain objects), user defined properties (UDPs—associated with domain objects), etc.

In a literal sense, the depicted 'admin domain objects' are the domain model objects contributed by the 'platform' itself. More specifically, the examples shows are contributed by (and potentially required by) the CDMR 54 component of the platform.

The depicted libraries and tools may comprise the CDMR 54. The first of these may be a reusable (JAVA) library for generating global unique identifiers (GUIDS) to serve as object identifiers. Other libraries may help with resolving/enforcing access controls (e.g. authorization), multi-tenancy controls, user defined property management, serialization (e.g. generic, reflection driven, formatting), etc. In this sense, the dividing line between the Domain Model's 46 class implementations, and the CDMR 54, is somewhat blurred. It may be thought of as something of a dashed line. However, all application/service logic should be strongly insulated from whatever happens under the covers of the domain class interfaces. This effectively raises the level of abstraction at which application/service logic is implemented.

Interaction Requirements

The Domain Model 46, and it's supporting CDMR 54, provides storage agnostic data sharing across the DCIM product line. In addition, the Domain-Model/CDMR duo addresses cross cutting concerns related to data access, delegation of appropriate tasks to the Manageability subsystem (MSS) 62, data change triggers/callbacks, etc. Domain Model 46 consumers are application services, common platform services and even the Manageability Subsystem 62. The MSS Services 50 relays discovery information as new instances of Domain Model 46 classes (stored in the CDMR 54). The Domain Model 46 may represent a single source of truth—and a single source of history.

Applications and Services 36—CRUD Domain Objects as required to support application features.

Reporting Data Access 64—Read only access to the Domain Objects for reporting purposes. This requires a "data provider" for a chosen reporting engine 66.

Admin UIs 68—CRUD Admin Domain Objects defining access policies, multi-tenancy policies, integrity constraint policies and other policies. These policies configure and drive the handling of crosscutting concerns.

Manageability Subsystem 62 delegation—Certain operations (e.g. commands, controls, etc.) associated with domain objects should be delegated to the Manageability Subsystem 62 for ultimate execution. Current, volatile data access (for sensor readings, etc.) should also be delegated to the Manageability Subsystem 62 for real-time fetching (versus latest value/estimate lookup).

ORM/RDBMS 60 access—Domain objects are persisted to the RDBMS 60 via an Object Relational Mapping technology (layer 70). Direct access to the underlying RDBMS is a circumvention of the Domain Model 46 (and supporting CDMR 54) layers. For application/service level logic, direct access to the underlying RDBMS 60 would be a serious architectural violation.

On the other hand, the Domain Model 46 and the CDMR 54 are deliberately extensible, should specific bits of domain class related logic be best implemented via hand-crafted SQL, stored procedures, etc. When faced with some of the relatively rare, but most challenging, implementation needs, it may be necessary to sprinkle the implementation logic at the application level, the domain model level and even the CDMR/ORM/RDBMS levels.

Reuse

The DCIM Solution's 10 product line's common data model leverages domain knowledge manifest in the representational models used in Aperture® Vista, the Avocent® MergePoint™ Infrastructure Explorer (AMIE), the information technology operations management (ITOM) library prototype, DSView, etc. The common data model may also leverage certain aspects of industry standards like the Distributed Management Task Force's (DMTF's) Common Information Model (CIM).

The CDMR 54 may be based on an industry-standard (SQL99) relational database management system (RDBMS).

Some of the most important domain classes, within the Domain Model 46, delegate manageability operations to the Manageability Subsystem 62. In addition, the Manageability Subsystem 62 feeds discovery/presence information, about domain class instances, into the Domain Model 46. Certain policies, for things like correlated event filtering, are also delegated to the Manageability Subsystem 62 for distributed processing (close to the sources of such events).

Manageability Subsystem

The Manageability Subsystem, represented by reference number 62, is shown in greater detail in FIG. 8. The Manageability Subsystem 62 provides the ability to discover and control Emerson and non-Emerson devices, and collect and analyze real time data from those devices. The Manageability Subsystem 62 may be made up of three major areas:

MSS Services 50—exposes public services on the platform 42 to provide applications and the Domain Model 46 with access to Manageability Subsystem 62 features such as the retrieval of historical data points that have been collected over time and the retrieval of data points on demand directly from the end devices. The Manageability Subsystem 62 provides private services used for communication between the platform 42 and the MSS Engines 56.

TSD 52 (Time Series Database)—stores the historical data points that have been collected over time. Applications and the Domain Model 46 can retrieve these data points through the public interfaces exposed on the platform 42.

Manageability Subsystem 62

MSS Engine 56—may be software that runs in the DCIM appliance 12 providing discovery and control of Emerson® and non-Emerson devices, and collection and analysis of the real time data from those devices. The MSS Engine 56 may contain the knowledge for how to communicate with Emerson® and non-Emerson devices. The MSS Engine 56 communicates with the MSS Services 50 running on the platform 42. Multiple MSS Engines 56 can be deployed in the customer environment to provide scalability as the number of managed devices to be supported grows. Each MSS Engine 56 may use a Complex Event Processor (CEP) 56a to ensure real time data aggregation and correlation. A Time Series Database 56b may be associated with each MSS Engine 56 for storing collected real time data. The following section briefly describes Manageability Subsystem 62 components with the Domain Model 46 and the MSS Engine 56/DCIM appliance 12.

Engine Management—An Engine Management service 71 provides the ability to manage Domain Model objects that represent the MSS Engines 56 and related objects, such as product knowledge and plug-ins. This service also provides the ability to add, update and manage MSS Engines 56 that are of the DCIM Solution 10.

Datapoint—A Datapoint service 72 provides the ability to access collected metric data and to configure the rules related to data point collection, aggregation, and analysis.

Infrastructure—An Infrastructure service 74 provides the ability to manage the infrastructure (devices, containers, relationships, collection rules, aggregation rules, and analysis rules) of the MSS Engine 56. The infrastructure service 74 keeps the infrastructure objects synchronized between the Domain Model 46 (and supporting CDMR 54) and the MSS Engines 56. As changes and additions are made to Domain Model objects on the platform 42 the necessary information is synchronized with the MSS Engines 56. The infrastructure service 74 service also handles synchronizing new and updated devices/relationships that are discovered by the MSS Engines 56 with the Domain Model 46 of the platform 42.

Discovery—A Discovery service 76 provides the ability to manage the discovery parameters and also provides means to perform on-demand discovery. The MSS Engines 56 actually perform the on-demand discovery and background discovery activities based on these configured discovery parameters.

Command—A Command service 78 provides the ability to execute commands on devices, such as PowerOff and PowerOn. The MSS Engines 56 actually handle sending the necessary commands to devices or appliances to cause the desired action on a device.

Event Receiver—An Event Receiver 80 service processes unsolicited events received from one or more MSS Engines 56. These events are converted as needed to match the Domain Model 46 definitions of the platform 42 and these events are then forwarded to the Events system of the platform 42.

Router—A Router component 82 handles the routing of requests between the MSS Services 50 and the MSS Engines 56. For requests from the MSS Services 50 this component determines the appropriate MSS Engine 56 to handle the request, such as an on-demand discovery request or a Power Off request. For request from the MSS Engines 56 this component determines the appropriate MSS Service to handle the request.

SiteWeb Protocol—A SiteWeb Protocol component 84 implements proprietary SiteWeb protocol and provides communication between MSS components and MSS Engine 56/DCIM appliance 12.

TSD Aggregator—A TSD Aggregator services 86 communicates with the TSD 60 to perform aggregation of infrastructure container(s) that span devices managed by more than one MSS Engine 56. The aggregation rules define how the data is aggregated and the results are stored in the TSD 60.

Video—A Video service 90 provides the ability to retrieve video content stored or captured in the MSS engines 56. Video data can be streamed from the MSS Engines 56 to consumers.

Realtime Data—A Realtime Data service 92 provides the ability to retrieve metric values in realtime in a streaming/ongoing manner from the MSS Engines 56. The real-time data can be streamed from the MSS Engines 56 to consumers.

TSD—A TSD service 88 provides the ability to manage Domain Model objects that represent the TSD 60 and the ability to configure the TSD 60.

Device Management—A Device Management service 94 provides the ability to perform upgrades, configure and manage devices.

Interaction Requirements

The MSS Services 50 manipulate domain objects via Java interfaces exposed by the Domain Model 46 for data persistence and access. This enables the following:

Provides basic create, update, delete, and querying of domain objects;
Allows for synchronization of new or updated domain objects identified by discovery of the MSS Engine 56;
Allows for synchronization of domain objects between the Platform 42 and the MSS Engines 56; and
Allows access to rules to control data aggregation and data analysis.

Delegate methods of the domain objects in the Domain Model 46 may consume public MSS Services 50 using SOAP via the Enterprise Service Bus (ESB) 44. These delegate methods may be used to perform the following activities:

Execution of commands, such as PowerOff;
Retrieve historical metric values;
Retrieve on-demand metric values; and
Perform on-demand discovery operations.

The public and private MSS Services 50 use the Router component 82 to route requests to the appropriate MSS Engine 56.

The MSS Services 50 consume CPS Platform Services of the platform 42 using SOAP via the ESB 44. The CPS Platform Services may be consumed for the following reasons.

Consume Authorization Service to determine that necessary rights for enforcement of functionality provided by the MSS Services 50;
Consume Licensing Services to determine what functionality is available by the MSS Services;
Consuming Eventing Service for the publishing of events; and
Consuming Eventing Services for the registration of notifications based on events.

The MSS Services 50 may use a suitable communications component to communicate with the MSS Engine 56.

The MSS Services 50 interacts with the MSS Engines 56 on the DCIM appliance 12 using a suitable communication component to achieve the following functionality.

Command Execution;
Discovery;
Data Collection;
Firmware Upgrades; and
Configuration.

An MSS UI 96 interacts with the Presentation server 40 (i.e., its controller) over HTTP and the controller interacts with the MSS Services 50 using SOAP or another suitable protocol (e.g., via the ESB 44).

The Application Services 36 (FIG. 5) consume video and real time data streaming via a publication/subscription mechanism from the MSS Services 50. The video and real time data streaming is retrieved from the MSS Engines 56.

DCIM Appliance

Figure 9:
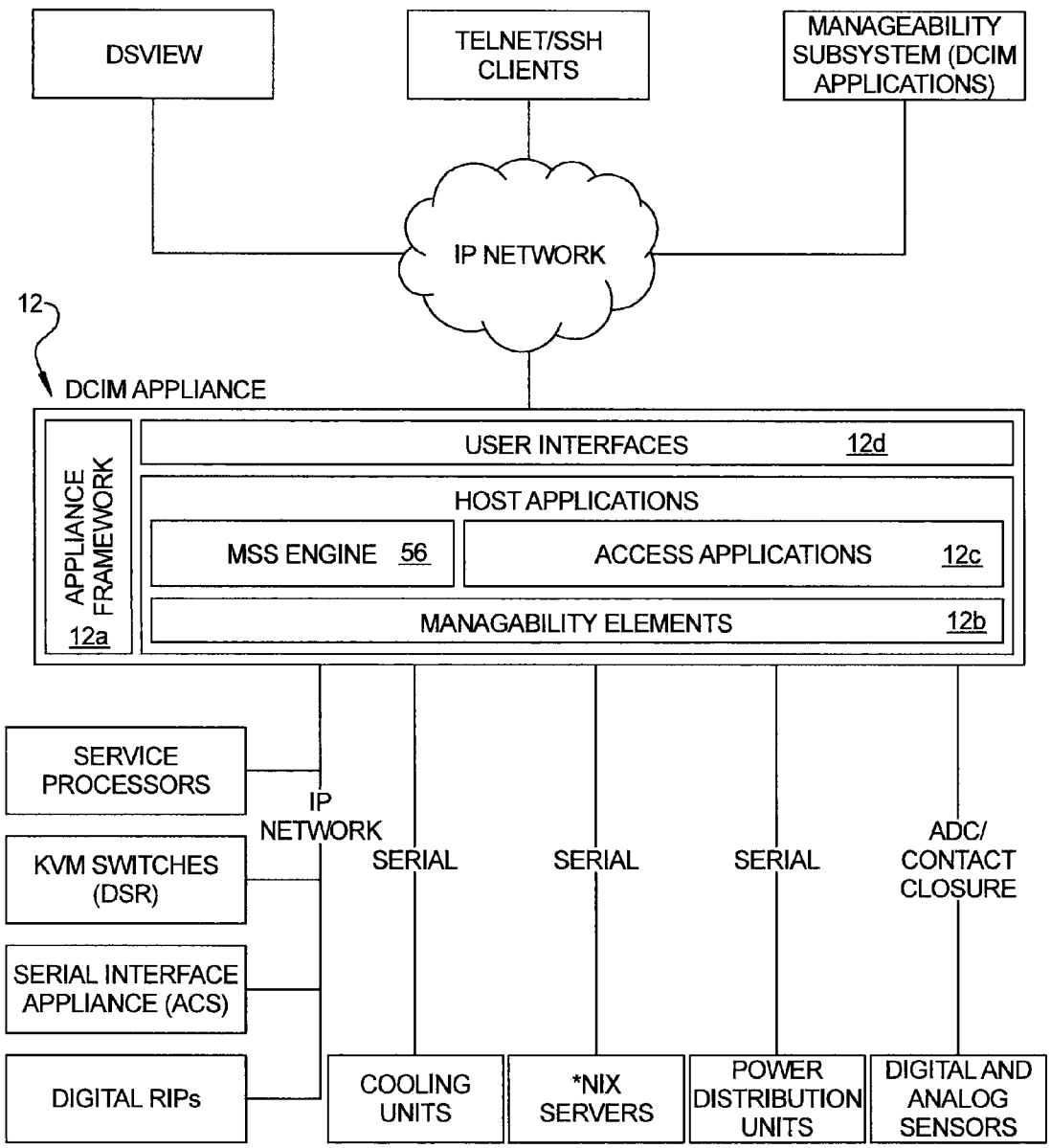
FIG. 9 is a high level diagram of one example of implementing the DCIM solution.

The DCIM appliance 12 is shown in one embodiment in FIG. 9. The DCIM appliance 12 provides the MSS Engine 56 capabilities and therefore provides the gateway between the DCIM Solution 10 application layers and the actual infrastructure devices which are being managed. It also provides a collection of industry standard interfaces such as a WebGUI, an SSH/Telnet based CLI, and SMASH/CLP which allow it to provide device management in a stand-alone environment. The external interfaces are purposely limited to provide a subset of the overall functionality available to the DCIM application suite. There are also Avocent specific protocols that may be used for access purposes which are currently consumed by DSView and may eventually be used for DCIM based access applications.

Architecture of DCIM Appliance

The detailed architecture of the DCIM appliance 12 may be thought of (at a high level) as being a system that is divided into three major areas including 1) Appliance Framework 12a; 2) Manageability Elements 12b/Access Applications 12c, and 3) User Interfaces 12d.

The Appliance Framework 12a provides a set of common services such as database management, authentication, and others which can be used by all of the components in the DCIM Solution 10. Another key part of the framework is a set of standardized communication interfaces that components can use to move data and messages around the DCIM Solution 10.

The "Manageability Elements 12b" can consist of components that know how to speak to the individual managed devices and equipment. Some examples of managed devices and equipment include:

KVM Switches;
Serial Interface appliances;
Power Distribution Units (PDUs);
Digital Rack Interface Pods;
Service Processors;
Cooling units;
Digital and Analog Sensors; and
$3^{rd}$ Party devices.

This area also includes the Application components which perform various tasks but do not have any external interfaces. The MSS Engine 56 components such as the CEP 56a and the Time Series Database 56b, as well as some extended features inherited from the access appliance, are all examples of applications.

The User Interface 12d may contain the user interfaces such as the Onboard WebUI, command line interfaces, and importantly a MSS Manageability Protocol for communicating with the MSS engines 56. The communication interfaces provided by the Appliance framework 12a allow a common method for the UI components to get data and send control messages to the various applications and manageability extensions.

The above described architecture enables the DCIM appliance 12 to be easily deployed in a variety of configurations with support for different numbers and types of managed elements being supported in each configuration. This design based on pluggable components, also allows for easily adding new classes of managed devices as the product line progresses.

Cloud Implementation of DCIM Solution 10

Figure 9A:
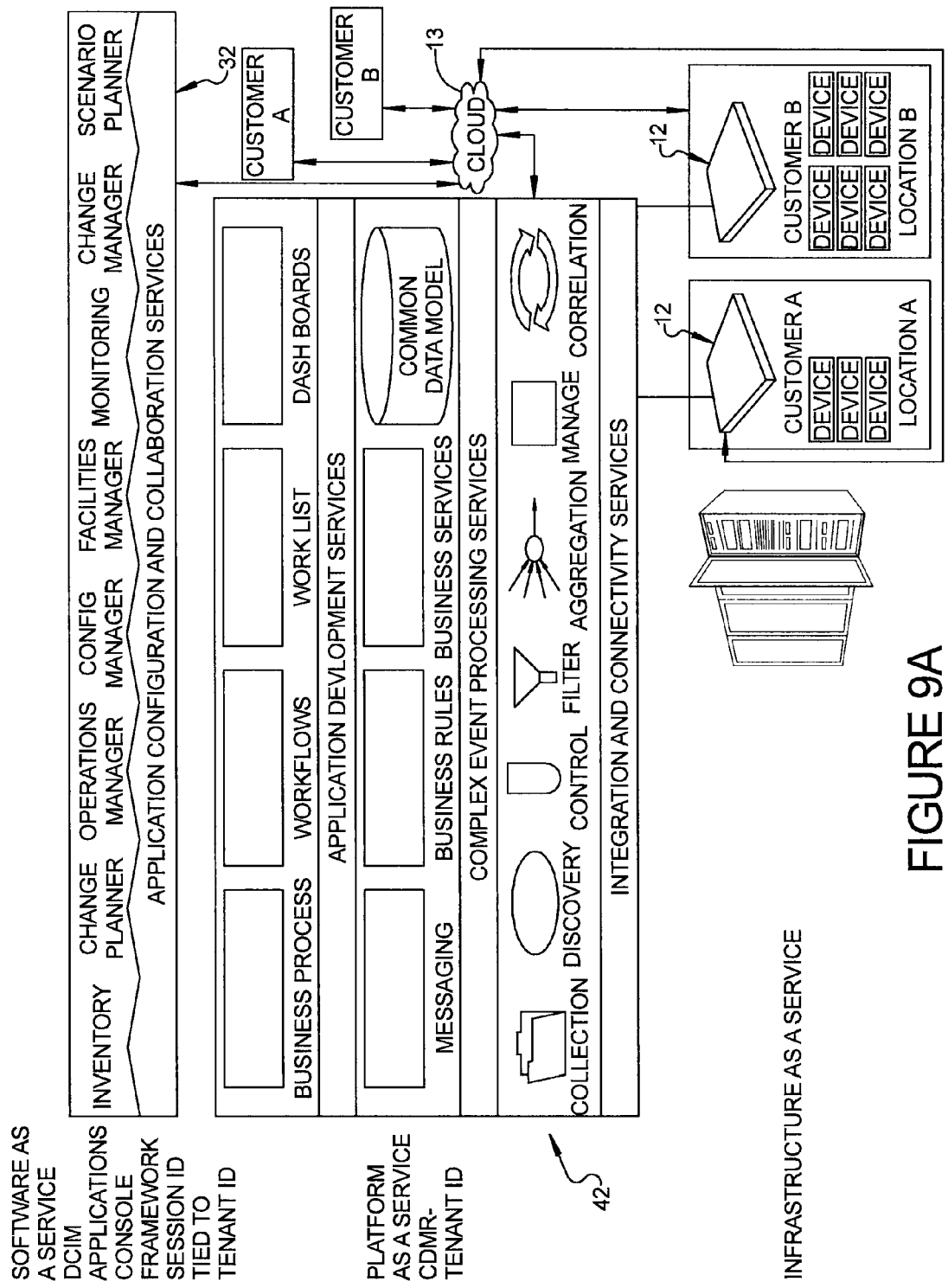
FIG. 9A is a high level diagram of one example of how the DCIM Solution may be implemented in a "cloud" environment.

Referring to FIG. 9A, one example of a "cloud" implementation of the DCIM Solution 10 is shown. In this example the Cloud 13 may be understood as any wide area network, but in one specific form it may comprise the World Wide Web (or simply the "Web"). For convenience the Cloud 13 will be referred to throughout as the "Web" 13.

The DCIM software suite of applications of the presentation UI 32 may be located at a first location, the Customers A and B may each be located at other remote locations, and the CPS 42 may be located at still another remote location. The DCIM appliances 12 may also be located at remote locations and each may be in communication with the CPS 42 and the presentation UI 32 via the Web 13. The Customers A and B may each be in communication with the presentation UI 32 via the Web 13, and the presentation UI 32 may in communication with the CPS 42 via the Web 13. Finally the appliances 12 may each be in communication with the CPS 42 via the Web 13. As will be appreciated, the cloud configuration shown in FIG. 9A enables each of the presentation UI 32 and the CPS 42 to be provided as a "service" over the Web 13. This enables one CPS 42 to be used to communicate with a plurality of DCIM appliances 12 located at different locations. Similarly, the presentation UI 32 could potentially be used "as a service" to communicate with a plurality of CPSs 42 located at different sites. This provides tremendous flexibility in scaling the DCIM Solution 10 to meet the needs of rapidly expanding data centers, and especially where managed equipment or devices are located in physically remote locations, possibly in different states or even in different countries. It will be appreciated that the diagram of FIG. 9A is only one possible configuration for deploying the DCIM Solution 10 in a "cloud" environment, and many other possible configurations will be apparent to those skilled in this art.

CONCLUSION

The DCIM Solution 10 can thus be seen to form a comprehensive family of hardware and software products that provides highly effective and efficient management of data center infrastructure. The DCIM Software Suite shown in FIG. 4 allows the datacenter manager to completely control and manage every aspect of his/her enterprise, whether locally or remotely, from a graphically rich, web-based user interface (UI). The DCIM appliance 12 helps to accomplish this through the use of a single piece of hardware (either per rack, per zone or per data center), where in the past multiple hardware devices/units have been required. Together, the DCIM appliance 12 and the DCIM Software Suite allow the datacenter manager not only to manage his/her current configuration, but to project and plan ahead for future needs, and when those needs become reality, to implement/accommodate them quickly, seamlessly and cost-effectively.

The overall DCIM Solution 10 also enables significant scalability. For one, the DCIM Solution 10 enables an option to connect to a separate database server of a DB server farm; and/or the ability to conform to load balancing systems for web access to a larger user community; and the ability to conform to reporting servers to serve a larger number of report requests. The DCIM Solution 10 also enables the ability to conform to security and access system requirements, and the ability to conform to directory services systems for authentication and authorization and role information for users.

What is claimed is:

1. A system for monitoring, controlling and optimizing power usage and cooling utilization within a data center, the system comprising:
   a common collection engine for collecting real time data directly from facility devices and information technology (IT) devices, and wherein the facility devices include cooling supply devices;
   a subsystem adapted to:
      obtain real time operating information on both the facility devices and the information technology (IT) devices;
      evaluate the real time operating information to provide utilization information with respect to at least one of the facility devices and at least one of the IT devices; and
   take action concerning at least one of the facility devices and at least one of the IT devices based on the real time operating information, and with the action being taken to optimize both cooling utilization and power usage of the at least one facility device in view of a performance of at least one of the IT devices.

2. The system of claim 1, wherein the subsystem is configured to provide an alert and diagnostic information for both of the facility devices and the IT devices.

3. The system of claim 1, wherein the facility devices also include at least one power supplying device.

4. The system of claim 1, wherein the subsystem includes a manageability subsystem services module for interfacing with, and monitoring operation of, at least one of the facility devices or at least one of the IT devices.

5. The system of claim 4, wherein the manageability subsystem services module is configured to control and command at least one of the facilities devices or at least one of the IT devices.

6. The system of claim 1, further including a module for considering space requirements for the IT devices and the facility devices, and for optimizing placement of at least one of the IT devices or at least one of the facility devices.

7. A system for real time monitoring and controlling of facility devices operating within a data center, in relation to electrical power being used by the information technology (IT) devices, in a manner that optimizes power usage by the IT devices, the system comprising:
   a subsystem configured:
      to obtain real time operating information on both of the facility devices and the IT devices, and wherein the facility devices include cooling supply devices;
      to evaluate the real time operating information to determine when an action should be taken relative to one or more of the facility devices, based on real time power and cooling requirements of the IT devices; and
      to enable modification of operation of the one or more facility devices to optimize both power usage and cooling utilization within the data center to enable a reduction in a buffer of cooling and power.

8. The system of claim 7, wherein the system further includes a module for considering space requirements for the facility devices and for the IT devices, and making recommendations regarding placement of the IT devices and the facility devices within the data center, to optimize space utilization within the data center.

9. The system of claim 7, wherein the subsystem is configured to use the real time operating information to maximize efficiency of the one or more of the facility devices.

10. The system of claim 7, wherein the subsystem is configured to provide real time alerts to a data center individual that signify that:
one or more predetermined facility operating conditions have occurred; or that one or more predetermined IT device operating conditions have occurred.

11. The system of claim 10, wherein the subsystem is configured to provide real time diagnostic information to the data center individual concerning the one or more facility devices.

12. The system of claim 10, wherein the subsystem is configured to provide real time diagnostic information to the data center individual concerning the one or more IT devices.

13. The system of claim 7, wherein the subsystem further is configured to consider space requirements for facility devices in a manner that optimizes placement of the facility devices within the data center.

14. A system for real time monitoring and controlling of facility devices operating within a data center, in relation to available electrical power and available cooling capacity in the data center, in a manner that enables optimization performance of the facility devices in relation to the available electrical power and the available cooling capacity of the facility devices, the system comprising:
a subsystem configured:
to obtain real time operating information on both facility devices and information technology (IT) devices, the facility devices including both power generating devices and cooling devices;
to evaluate the real time operating information to determine when an action should be taken relative to one or more of the IT devices;
to modify at least one of a location or operation of the one or more IT devices to help optimize both power and cooling utilization from the power generating devices and the cooling devices, and in consideration of performance of the one or more IT devices within the data center; and
to enable modification of an operation of at least one of the facility devices as needed to optimize performance of the one or more IT devices.

15. The system of claim 14, wherein the subsystem is further adapted to consider space requirements of the facilities devices and the IT devices and to assist a data center individual in placement of the facilities devices and the IT devices within the data center to optimize utilization of at least one of power resources or cooling resources within the data center.

16. The system of claim 14, wherein the subsystem is further configured to perform real time diagnostics on at least one of the IT devices.

17. A method for monitoring, controlling and optimizing, power usage and cooling utilization within a data center infrastructure, the method comprising:
obtaining real time information concerning both facility devices and information technology (IT) devices being used within the data center infrastructure, wherein the facility devices include cooling supply devices;
using a processing system to evaluate the real time information to provide at least one of an alert and diagnostic information with respect to at least one of the facility devices or at least one of the IT devices; and
taking action concerning the at least one of the facility devices or the at least one of the IT devices, based on the real time information, and with the action being to optimize both cooling utilization and power usage of the facility devices, while taking into account operation of the at least one of the IT devices, to validate performance guidelines.

18. The method of claim 17, further comprising considering space requirements for at least one of the facility devices and at least one of the IT devices, and providing information regarding the space requirements to a data center individual to assist in selecting placement of the at least one facility device and the at least one IT device within the data center infrastructure.

19. The method of claim 17, further comprising performing real time diagnostic operations on at least one of the facility devices or at least one of the IT devices in the event of an operating anomaly affecting the at least one of the facility devices or the at least one of the IT devices.

20. The method of claim 19, further comprising modifying operation of at least a different one of the IT devices or a different one of the facility devices, to optimize performance of at least one of power utilization, cooling utilization, or performance of other ones of the IT devices within the data center infrastructure.

* * * * *